United States Patent
Sharon et al.

(10) Patent No.: US 9,165,649 B2
(45) Date of Patent: Oct. 20, 2015

(54) SYSTEMS AND METHODS OF SHAPING DATA

(71) Applicant: SANDISK TECHNOLOGIES INC., Plano, TX (US)

(72) Inventors: Eran Sharon, Rishon Lezion (IL); Tz-Yi Liu, Palo Alto, CA (US); Tianhong Yan, Saratoga, CA (US); Idan Alrod, Herzliya (IL)

(73) Assignee: SANDISK TECHNOLOGIES INC., Plano, TX (US)

( * ) Notice: Subject to any disclaimer, the term of this patent is extended or adjusted under 35 U.S.C. 154(b) by 136 days.

(21) Appl. No.: 14/136,740

(22) Filed: Dec. 20, 2013

(65) Prior Publication Data

US 2015/0179260 A1 Jun. 25, 2015

(51) Int. Cl.
*G06F 13/00* (2006.01)
*G11C 14/00* (2006.01)
*G11C 5/14* (2006.01)
*G11C 13/00* (2006.01)

(52) U.S. Cl.
CPC .............. *G11C 14/0045* (2013.01); *G11C 5/14* (2013.01); *G11C 13/0002* (2013.01)

(58) Field of Classification Search
None
See application file for complete search history.

(56) References Cited

U.S. PATENT DOCUMENTS

| 6,218,968 | B1 | 4/2001 | Smeets et al. |
| 8,947,931 | B1 * | 2/2015 | D'Abreu ................. 365/185.05 |
| 2008/0158948 | A1 | 7/2008 | Sharon et al. |
| 2011/0228590 | A1 * | 9/2011 | Murooka ...................... 365/148 |
| 2011/0291761 | A1 * | 12/2011 | Rao ............................... 330/277 |
| 2012/0294064 | A1 * | 11/2012 | Kitagawa et al. ............. 365/148 |
| 2013/0024747 | A1 | 1/2013 | Sharon et al. |
| 2013/0103891 | A1 | 4/2013 | Sharon et al. |
| 2014/0050020 | A1 * | 2/2014 | Lee et al. ...................... 365/158 |

FOREIGN PATENT DOCUMENTS

WO 2010092536 A1 8/2010

* cited by examiner

*Primary Examiner* — Michael Sun
(74) *Attorney, Agent, or Firm* — Toler Law Group, PC (57) ABSTRACT

A method of shaping data includes receiving data represented as a first set of bits, where each bit of the first set of bits corresponds to a logical value. A first write current to write a first logical value to a storage element is less than a second write current to write a second logical value to the storage element. The method also includes applying a shaping operation to generate a second set of bits, where a proportion of bits having the first logical value is larger for the second set of bits than for the first set of bits. The method also includes writing the second set of bits to the memory.

30 Claims, 7 Drawing Sheets

SYSTEMS AND METHODS OF SHAPING DATA

FIELD OF THE DISCLOSURE

The present disclosure is generally related to shaping data for storage at a memory.

BACKGROUND

Resistance-based random access memory devices use a variable resistive material to store data. The variable resistive material has a resistance that can be changed responsive to a programming voltage. For example, a storage element of a resistance-based random access memory device may be programmed to a first resistance state to indicate storage of a first logical value (e.g., a "0" value) and may be programmed to a second resistance state to indicate storage of a second logical value (e.g., a "1" value).

Storage elements of a resistance-based random access memory device can be arranged in a three-dimensional structure. In such a structure, each storage element may be placed between a bitline and wordline. For example, a first storage element may be coupled to a first bitline and a first wordline. A second storage element may be coupled to the first bitline and a second wordline. Another storage element may be coupled to a second bitline and the first wordline. In this arrangement, to read the first storage element, a read voltage may be applied across the first storage element by applying a first voltage (e.g., a relatively high voltage) to the first bitline and applying a different voltage (e.g., a relatively low voltage) to the first wordline. A sense amplifier coupled to the first bitline may sense current that flows through the first bitline. The current flowing through the first bitline may correspond to current that flows through the first storage element responsive to the voltage across the first storage element. Thus, the current can be used to determine a resistance state of the first storage element using Ohm's law.

Since the storage elements of the resistance-based random access memory device store logical values based on resistance state, different read currents are used to read different logical values. For example, reading a storage element that is in a low resistance state uses more read current than reading a storage element that is in a high resistance state.

SUMMARY

In a particular embodiment, data to be stored at a resistance-based random access memory device may be shaped before storage to reduce write current used to store the data, to reduce read current used to read the data, or both. For example, the data may be represented as a first set of bits with each bit representing a logical value. The shaping operation may be used to generate a second set of bits. The second set of bits may be decodable (e.g., using an unshaping operation) to recreate the first set of bits. The second set of bits may include a different set of logical values than the first set of bits. As a result, a different (e.g., smaller) write current may be used to store the second set of bits than to store the first set of bits, a different (e.g., smaller) read current may be used to read the second set of bits than to read the first set of bits, or both. Data may also be shaped before storage to reduce disturbance effects. For example, write current associated with one logical value may be higher than the write current associated with another logical value. Reducing the write current may allow reduction of disturbance affects, e.g. by operating the memory at lower voltage levels. As another example, data may also be shaped before storage to improve write performance. For example, write current associated with one logical value may be higher than the write current associated with another logical value. Reducing the write current may allow programming a larger number of storage elements simultaneously.

In a particular embodiment, a method is performed in a data storage device having a memory including a plurality of resistance-based storage elements. The method includes receiving data represented as a first set of bits, each bit of the first set of bits corresponding to a logical value, where a first write current to write a first logical value to a storage element is less than a second write current to write a second logical value to the storage element. The method also includes applying a shaping operation to generate a second set of bits, where a number of bits having the second logical value is smaller for the second set of bits than for the first set of bits. The method also includes writing the second set of bits to the memory.

In another particular embodiment, a data storage device includes a controller and a memory including a plurality of resistance-based storage elements. The controller is configured to receive data represented as a first set of bits, each bit of the first set of bits corresponding to a logical value, where a first write current to write a first logical value to a storage element of the memory is less than a second write current to write a second logical value to the storage element of the memory. The controller is further configured to apply a shaping operation to generate a second set of bits, where a number of bits having the second logical value is smaller for the second set of bits than for the first set of bits. The controller is also configured to write the second set of bits to the memory.

Writing some logical values to the memory may use more write current than writing other logical values to the memory. For example, writing a first logical value (e.g., a logical "1" value) to a particular resistance-based storage element may use less write current than writing a second logical value (e.g., a logical "0" value) to the resistance-based storage element. As a result of a shaping operation, the proportion of bits having the first logical value may be larger for the shaped data than for the original data. Accordingly, writing the shaped data to the memory uses less write current than writing the original data to the memory would use. This may be true even if the shaped data is longer than the original data due to shaping coding. The overall optimization may take into account the expansion factor as well as the reduction of current due to the different proportion between "1" and "0" values. Further, reading some logical values from the memory may use more read current than reading other logical values from the memory. Thus, applying the shaping operation may also enable the shaped data to be read from the memory using less read current than would be used to read the original data from the memory. The shaping operation may be configured to optimize or improve overall current consumption of a data storage device by reducing write current, read current or both.

DETAILED DESCRIPTION

Figure 1:
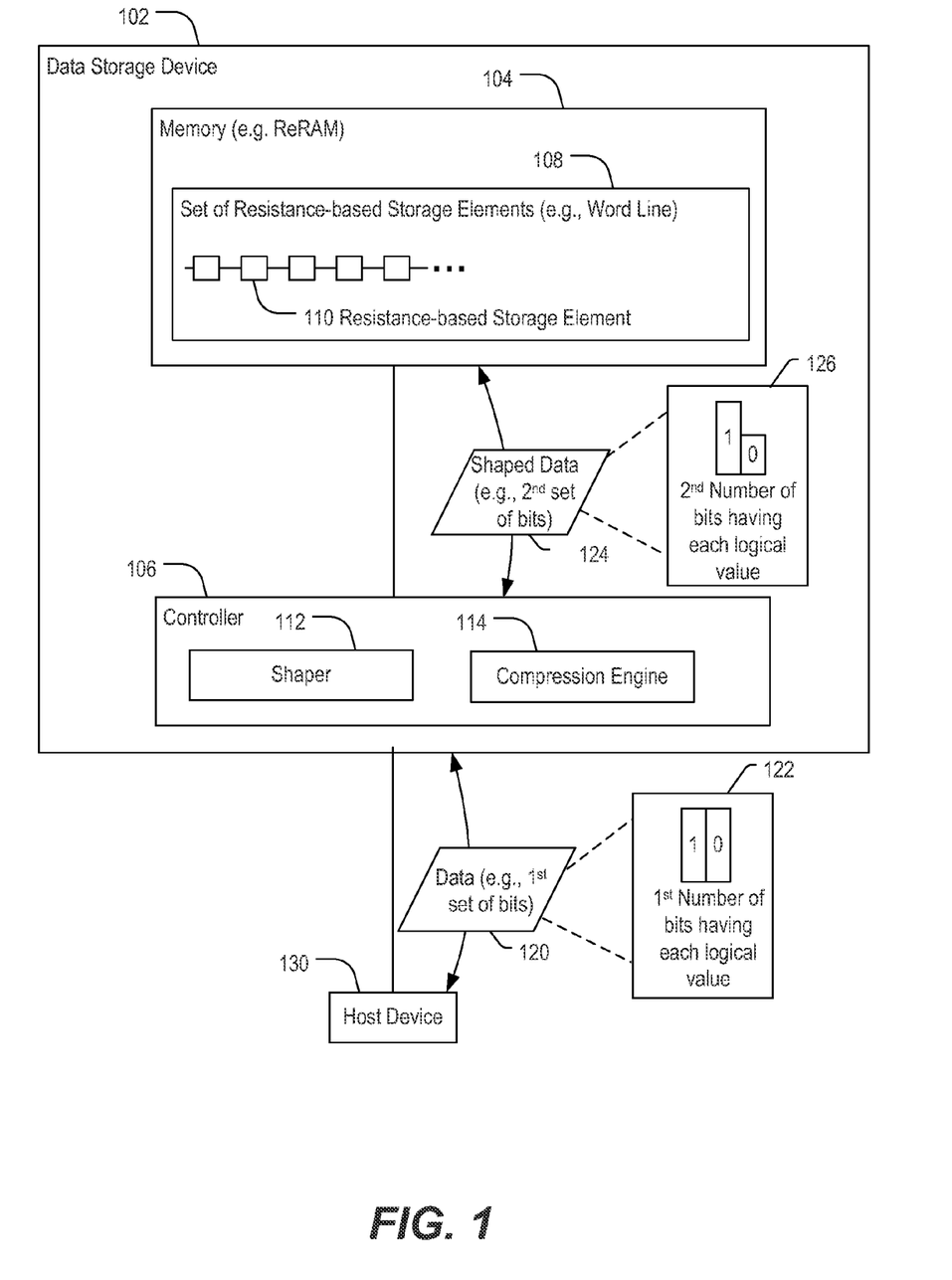
FIG. 1 a block diagram of a particular embodiment of a system including a data storage device configured to shape data for storage.

FIG. 1 a block diagram of a particular embodiment of a system including a data storage device 102 configured to shape data for storage. The data storage device 102 includes a controller 106 and a memory 104. In a particular implementation, the memory 104 is on a memory die that is separate from the controller 106 and coupled to the controller 106 via a bus. In other implementations, the memory 104 and the controller 106 may be on a common die.

The memory 104 may be a Resistive Random Access Memory (also known as RRAM or ReRAM) that includes a plurality of resistance-based storage elements. For example, the memory 104 may include a set of resistance-based storage elements 108 corresponding to a wordline. Each resistance-based storage element (such as a representative resistance-based storage element 110) may store a logical value based on a resistance state of the storage element. For example, a logical "1" value may be represented by programming the storage element 110 to have a high resistance state, and a logical "0" value may be represented by programming the storage element 110 to have a low resistance state. Alternatively, a logical "1" value may be represented by programming the storage element 110 to have a low resistance state, and a logical "0" value may be represented by programming the storage element 110 to have a high resistance state.

The data storage device 102 may be configured to interface with a host device 130. The host device 130 may be configured to provide data, such as data 120, to be stored at the memory 104 or to request data to be read from the memory 104. For example, the host device 130 may include a mobile telephone, a music player, a video player, a gaming console, an electronic book reader, a personal digital assistant (PDA), a computer, such as a laptop computer, notebook computer, or tablet, any other electronic device, or any combination thereof. The host device 130 communicates via a memory interface that enables reading from the data storage device 102 and writing to the data storage device 102. For example, the host device 130 may operate in compliance with a Joint Electron Devices Engineering Council (JEDEC) industry specification, such as an eMMC specification. As other examples, the host device 130 may operate in compliance with a USB or a UFS specification. The host device 130 may communicate with the data storage device 102 in accordance with any other suitable communication protocol.

The data storage device 102 includes the memory 104 coupled to a controller 106. For example, the data storage device 102 may be a memory card. As another example, the data storage device 102 may be configured to be coupled to the host device 130 as embedded memory. The data storage device 102 may operate in compliance with a JEDEC industry specification, one or more other specifications, or a combination thereof. For example, the data storage device 102 may operate in compliance with a an eMMC specification, in compliance with a USB or a UFS specification, or a combination thereof.

In a particular embodiment, the controller 106 includes a shaper 112. The shaper 112 is configured to apply a shaping operation, as further described below, to data received from the host device 130 to be stored at the memory 104. The shaper 112 may also be configured to apply an unshaping operation to data read from the memory 104 to be sent to the host device 130. The controller 106 may also include a compression engine 114 configured to apply a compression operation to data received from the host device 130 to be stored at the memory 104 and to apply an uncompression operation to data read from the memory 104. In a particular embodiment, the controller 106 may perform shaping and compression operations concurrently, as described further below.

The controller 106 may be configured to receive data (such as the data 120) from the host device 130. The data 120 may be represented as a first set of bits, where each bit corresponds to a logical value. The shaper 112 may apply a shaping operation to generate shaped data 124 including a second set of bits. The first set of bits may include a first number of bits having each logical value 122, and the second set of bits may include a second number of bits having each logical value 126. As a result of the shaping operation, the first number of bits having each logical value 122 may be different than the second number of bits having each logical value 126. For example, in the first data 120, a number of bits having a first logical value (e.g., a logical "1" value) may be approximately equal to a number of bits having a second logical value (e.g., a logical "0" value). However, in the shaped data 124, the number of bits having the second logical value (e.g., the logical "0" value) may be reduced. The number of bits having the first logical value (e.g. the logical "1" value) may also be reduced in the shaped data 126 or may be unchanged relative to the first data 120.

For example, the shaping operations may include mapping a set of bits corresponding to a set of logical values of the data 120 to a second set of bits corresponding to a different set of logical values to form the shaped data 124. In the this example, the mapping may be static (e.g., may use a predetermined mapping of bits or sets of bits) or may be dynamic. When the mapping is dynamic, the mapping may be dynamically adjusted such that frequently occurring sets of logical values received from the host device 130 are mapped to sets of logical values that are associated with reduced current consumption. To illustrate, the controller 106 may count each occurrence of a particular set of logical values in the data 120. The controller 106 may map a most frequently occurring set of logical values (e.g., "101") to a lowest current consumption set of logical values (e.g., "111"). In this illustrative example, each occurrence of the most frequently occurring set of logical values (e.g., "101") in the data 120 may be replaced with the lowest current consumption set of logical values (e.g., "111") in the shaped data 124. The controller 106 may store a key or mapping table to enable unshaping of the shaped data 124 to recreate the data 120 during a subsequent read operation. In the second example, the shaped data 124 may include the same number of bits as the data 120 or a different number of bits. Thus, in this example, the total number of bits of the shaped data 124 may be the same as the total number of bits of the data 120. However, the second number of bits having each logical value 126 may be different than the first number of bits having each logical value 122.

In another example, different shaping operations may be performed for different data. To illustrate, compressible data and non-compressible data may be shaped differently. In this example, the controller 106 may determine whether at least a subset of the data 120 (e.g., a subset of the first set of bits) is compressible. When a first subset of the data 120 is non-compressible, a first shaping operation may be applied to the first subset of the first set of bits (e.g., a first static or dynamic mapping operation may be performed). When a second subset of the first set of bits is compressible, a second shaping operation may be applied to the second subset of the first set of bits. The second shaping operation may be different from the first shaping operation. To illustrate, the second shaping operation may include sequentially or concurrently compressing and shaping the second subset of the first set of bits to form compressed and shaped bits. The compressed and shaped bits may include the same number of bits as the second subset of the first set of bits or may include fewer bits than the second subset of the first set of bits.

The controller 106 may be configured to write the shaped data 124 including the second set of bits to the memory 104. Writing some logical values to the memory 104 may use more write current than writing other logical values to the memory 104. For example, a first write current to write a first logical value (e.g., a logical "1" value) to the storage element 110 may be less than a second write current to write a second logical value (e.g., a logical "0" value) to the storage element 110. As a result of the shaping operation, the number of bits having the second logical value may be smaller for the shaped data 124 than for the data 120. Accordingly, writing the shaped data 124 to the memory 104 uses less write current than writing the data 120 to the memory 104 would use. Additionally, reading some logical values from the memory 104 may use more read current than reading other logical values from the memory 104. For example, a first read current to read a first logical value (e.g., a logical "1" value) from the storage element 110 may be less than a second read current to read a second logical value (e.g., a logical "0" value) from the storage element 110. Accordingly, reading the shaped data 124 from the memory 104 uses less read current than reading the data 120 from the memory 104. The shaping operation may be configured to optimize or improve overall current consumption of the data storage device 102 by reducing write current, read current or both.

Figure 2:
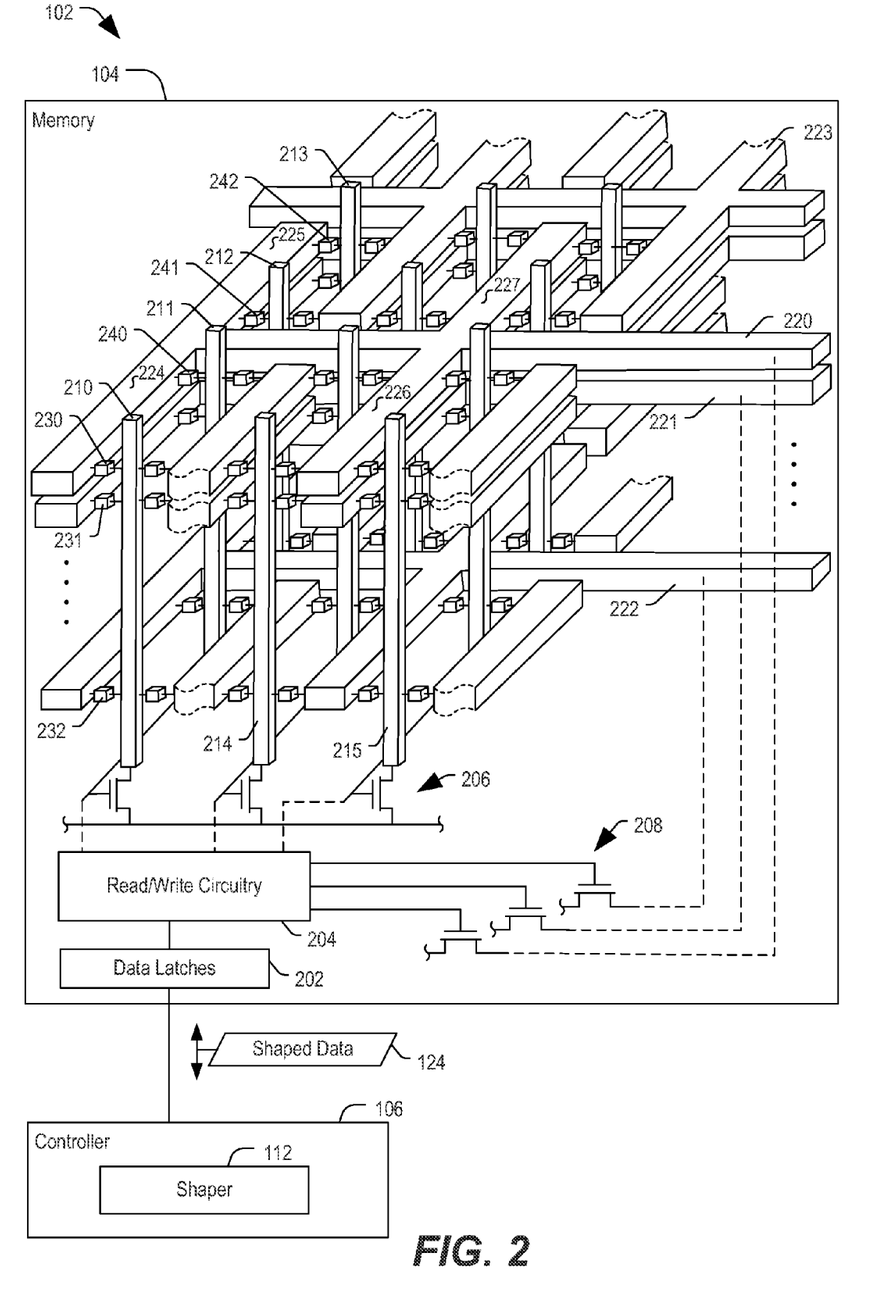
FIG. 2 is a diagram of a particular embodiment of the data storage device of FIG. 1.

FIG. 2 is a diagram of a particular embodiment of the data storage device 102 of FIG. 1. FIG. 2 illustrates a portion of a three-dimensional architecture of the memory 104 according to a particular embodiment. In the embodiment illustrated in FIG. 2, the memory 104 is a vertical bitline Resistive Random Access Memory (ReRAM) with a plurality of wordlines (such as representative wordlines 220, 221, 222, and wordline 223 (only a portion of which is shown in FIG. 2)) and a plurality of bitlines (such as representative bitlines 210, 211, 212, and 213). The memory 104 also includes a plurality of resistance-based storage elements (such as representative storage elements 230, 231, 232, 240, 241, and 242), each of which is coupled to a bitline and a wordline. The memory 104 also includes data latches 202 and read/write circuitry 204. The read/write circuitry 204 is coupled to wordline drivers 208 and bitline drivers 206.

In a particular embodiment, the controller 106 is configured to determine a set of storage elements to which the data is to be written and to determine a shaping operation to be applied by the shaper 112 based on a characteristic of at least one of the storage elements of the set of storage elements. The characteristic may be related to a location of the storage element, data stored at other storage elements, other characteristics, or a combination thereof.

In an illustrative embodiment, the shaping operation applied by the shaper 112 to generate the shaped data 124 may be determined by the controller 106 or the shaper 112 based on the location-dependent current consumption of a storage element (e.g., current used to read or write to a storage element based on a physical location of the storage element in the memory 104). For example, in the embodiment illustrated in FIG. 2, each of the wordlines includes a plurality of fingers (e.g., a first wordline 220 includes fingers 224, 225, 226, and 227). Each finger may be coupled to more than one bitline. To illustrate, a first finger 224 of the first wordline 220 is coupled to a first bitline 210 via a first storage element 230 at a first end of the first finger 224 and is coupled to a second bitline 211 via a second storage element 240 at a second end of the first finger 224. As a result of the physical locations of the first and second storage elements 230, 240 in the memory 104, the first and second storage elements 230, 240 may use different read and write currents. In this example, a first shaping operation may be applied to data that is to be stored at storage elements coupled to first ends of fingers of one or more wordlines, and a second shaping operation may be applied to data that is to be stored at storage elements coupled to second ends of fingers of the one or more wordlines. The first and second shaping operations may be different. For example, more aggressive shaping (e.g., shaping that is more likely to skew the distribution of logical values) may be applied to data to be stored at storage elements that have higher location-dependent current consumption, and less aggressive shaping (e.g., shaping that is less likely to skew the distribution of logical values) may be applied to data to be stored at storage elements that have lower location dependent current consumption. As a specific example, a dynamic mapping shaping operation may be applied to the data to be stored at the storage elements that have the higher location-dependent current consumption, and a different shaping coding may be applied to the data to be stored at the storage elements that have the lower location dependent current consumption. In another example, the current is not location dependent, however, as the finger has non-negligible resistance, a storage element located at the far side of the finger (e.g. element 230) and having a large write current (i.e. being at the "on"/low resistance state) will result in a higher voltage drop across the finger compared to a storage element which is located at the near side of the finger (e.g. element 240) and having a large write current. In order to compensate for this voltage drop, higher voltages may be applied, resulting in higher disturbance effects. Alternatively fewer storage elements may be programmed simultaneously (to maintain an acceptable voltage drop), resulting in lower write performance. Hence, applying higher shaping to storage elements which are at the far side of the finger (e.g. element 230) is more beneficial, while lower shaping level may be applied to storage elements which are at the near side of the finger (e.g. element 240). Shaping based on a location of a storage element on the finger will reduce the probability of having storage elements at the low resistance state ("on" state), which have a larger write current, at the far side of the finger, compared to storage elements in the near side of the finger. As applying shaping uses redundancy (which translates into memory cost), adjusting the distribution of the shaping effort differently according to the expected benefit may be beneficial.

As another example of location-dependent current consumption of a storage element, in the embodiment illustrated in FIG. 2, each bitline may be coupled to more than one wordline. To illustrate, the first bitline 210 is coupled to the first wordline 220 via the first storage element 230 and is coupled to a third wordline 222 via a third storage element 232. As a result of the physical locations of the first and third storage elements 230, 232 in the memory 104, the first and third storage elements 230, 232 may use different read and write currents. In this example, a different shaping operation may be applied to data that is to be stored at storage elements coupled to the first bitline 210. Alternatively, received data (e.g., a received codeword) may be stored at a single wordline, and the shaping operation may be applied in a manner that causes a probability that every storage element on a particular bitline (e.g., the first bitline 210) has a low-resistance state to be less than a threshold probability.

In a particular embodiment, current consumption to read from or write to a storage element is related to logical values stored at adjacent or nearby storage elements, such as other storage elements on the same bitline. For example, storage elements that are in a low resistance state may have more leakage current than storage elements at a high resistance state. Thus, each storage element on a bitline (e.g., the first bitline 210) that is in a low resistance state increases leakage current during read and write operations. In this embodiment, the shaping operation may be determined such that a probability that every storage element on a particular bitline (e.g., the first bitline 210) has a low-resistance state is less than a threshold probability.

During a write operation, the controller 106 may receive data from a host device, such as the host device 130 of FIG. 1. The controller 106 or the shaper 112 may determine a shaping operation to be applied to the data. The shaping operation may be selected or determined based on characteristics of the data (e.g., whether the data is compressible or not), based on characteristics of the memory 104 (e.g., location-dependent current consumption associated with one or more storage elements to which the data is to be written or logical values stored at other storage elements), or a combination thereof. The shaping operation may include mapping bits of the data to other bits, compressing at least a subset of the data, or both.

After the shaped data 124 is generated, the shaped data 124 may be provided to the data latches 202. The read/write circuitry 204 may read bits from the data latches 202 and apply selection signals to selection control lines coupled to the wordline drivers 208 and the bitline drivers 206 to cause a write voltage to be applied across a selected storage element. For example, to select the first storage element 230, the read/write circuitry 204 may activate the wordline drivers 208 and the bitline drivers 206 to drive a programming current (also referred to as a write current) through the first storage element 230. To illustrate, a first write current may be used to write a first logical value (e.g., a value corresponding to a high-resistance state) to the first storage element 230, and a second write current may be used to write a second logical value (e.g., a value corresponding to a low-resistance state) to the first storage element 230. The programming current may be applied by generating a programming voltage across the first storage element 230 by applying a first voltage to the first bitline 210 and to wordlines other than the first wordline 220 and applying a second voltage to the first wordline 220. In a particular embodiment, the first voltage is applied to other bitlines (e.g., the bitlines 214, 215) to reduce leakage current in the memory 104.

During a read operation, the controller 106 may receive a request from a host device, such as the host device 130 of FIG. 1. The controller 106 may cause the read/write circuitry 204 to read bits from particular storage elements of the memory 104 by applying selection signals to selection control lines coupled to the wordline drivers 208 and the bitline drivers 206 to cause a read voltage to be applied across a selected storage element. For example, to select the first storage element 230, the read/write circuitry 204 may activate the wordline drivers 208 and the bitline drivers 206 to apply a first voltage (e.g., 0.7 V) to the first bitline 210 and to wordlines other than the first wordline 220. A lower voltage (e.g., 0 V) may be applied to the first wordline 220. Thus, a read voltage is applied across the first storage element 230, and a read current corresponding to the read voltage may be detected at a sense amplifier of the read/write circuitry 204. The read current corresponds (via Ohm's law) to a resistance state of the first storage element 230, which corresponds to a logical value stored at the first storage element 230. The logical value read from the first storage element 230 and other elements read during the read operation may be saved at the data latches 202 and provided to the controller 106 as shaped data 124.

If the shaper 112 applies different shaping operations to different data (e.g., based on where in the memory 104 the data is to be stored, based on logical values stored at other portions of the memory 104, or based on a frequency of occurrence of particular sets of bits in the data), the controller 106 or the shaper 112 may determine a shaping operation that was applied to generate the shaped data 124. For example, the shaped data 124 may include or may be associated with a shaping key that indicates a shaping operation applied to generate the shaped data 124. In another example, the shaping operation may be determined based on characteristics associated with the shaped data 124 or the storage elements from which the shaped data 124 was read. To illustrate, the shaped data 124 may include a set of shaping parity bits that are selected to be distinguishable from the data. In another illustrative example, when different shaping operations are performed based on physical location of storage elements in the memory 104, the shaped data 124 may be unshaped by reversing the location dependent shaping operations. After unshaping the shaped data 124, the original data received from the host device may be reconstructed. Other operations, such as decompression and error correction may also be performed to reconstruct the original data. After the original data is reconstructed, the data may be provided to the host device.

Figure 3:
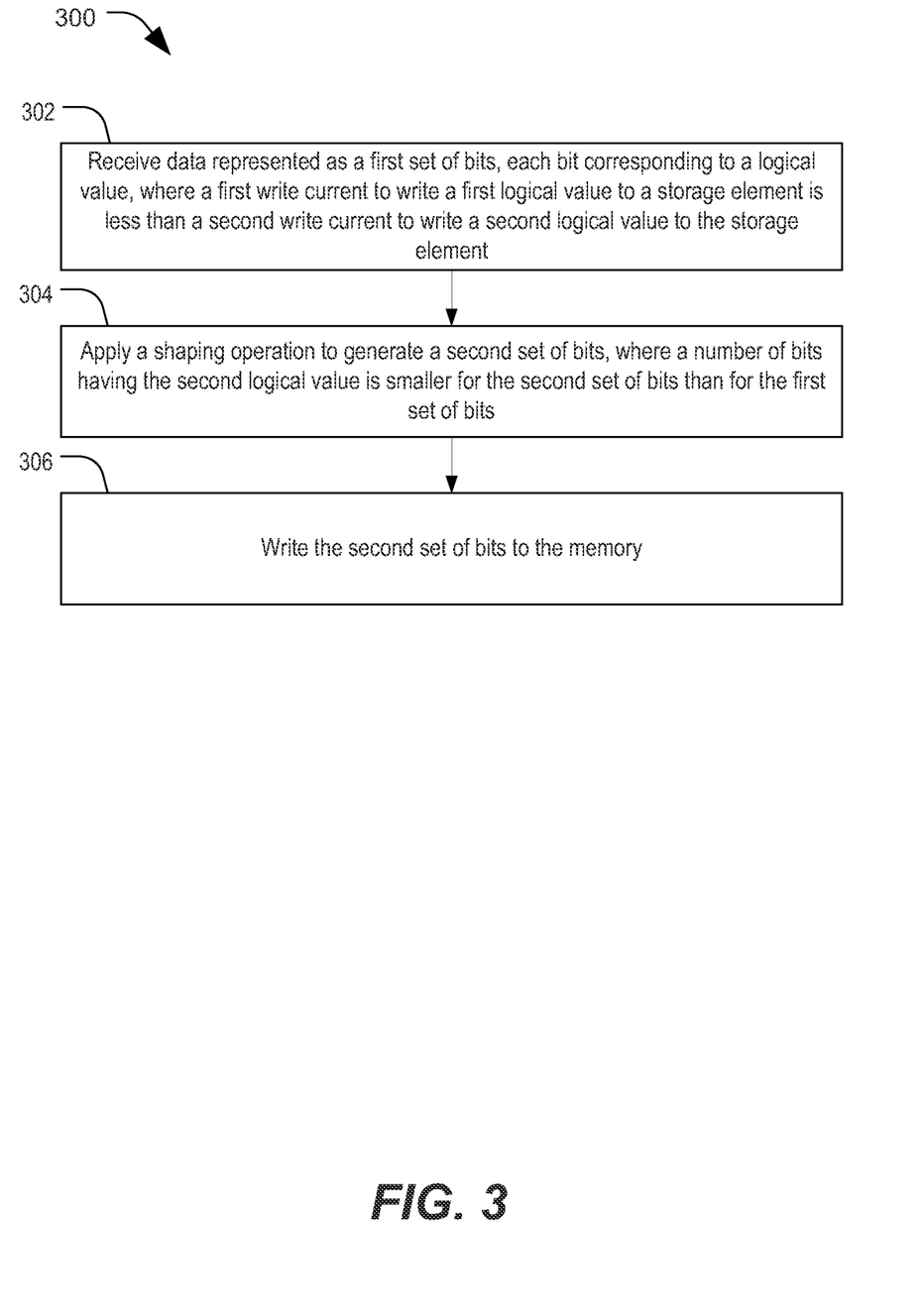
FIG. 3 is a flow diagram illustrating a first particular embodiment of a method of shaping and writing data at a data storage device.

FIG. 3 is a flow diagram illustrating a first particular embodiment of a method 300 of shaping and writing data at a data storage device including a memory having a plurality of resistance-based storage elements. The data storage device may correspond to the data storage device 102 of FIG. 1, the data storage device 102 of FIG. 2, or both. For example, the method 300 may be performed at the controller 106 of FIG. 1 or FIG. 2.

The method 300 includes, at 302, receiving data represented as a first set of bits, where each bit corresponds to a logical value. For example, the data storage device 102 of FIG. 1 may receive the data 120 from the host device 130. As described above, the data storage device 102 may use a first write current to write a first logical value (e.g., a value corresponding to a high-resistance state) to a storage element and may use a second write current to write a second logical value (e.g., a value corresponding to a low-resistance state) to the storage element. In a particular embodiment, the first write current is less than the second write current.

The method 300 also includes, at 304, applying a shaping operation to generate a second set of bits. The second set of bits is generated such that a number of bits having the second logical value is smaller for the second set of bits than for the first set of bits. For example, as shown in FIG. 1, the second number of bits having each logical value 126 has fewer logical "0" values than the first number of bits having each logical value 122. Accordingly, writing the second set of bits to the memory may use a lower write current (also referred to as a programming current) than a write current that would be used to write the first set of bits to the memory. As an example, in the embodiment illustrated in FIG. 1, for a particular storage element, a larger programming current is used to write a logical "0" value than to write a logical "1" value. In this embodiment, the shaped data 124 includes fewer logical "0" values than the data 120. As another example, for a particular storage element, a larger programming current may be used to write a logical "1" value than to write a logical "0" value. In this example, the shaped data 124 would include fewer logical "1" values than the data 120.

In a particular embodiment, the data storage devices uses a first read current to read a first logical value (e.g., a value corresponding to a high-resistance state) from a storage element and uses a second read current to read a second logical value (e.g., a value corresponding to a low-resistance state) from the storage element. The first read current may be less than the second read current. As an example, for a particular storage element, a larger read current may be used to read a logical "0" value than to read a logical "1" value. In this example, the second set of bits may include fewer logical "0" values than the first set of bits. As another example, for a particular storage element, a larger read current may be used to read a logical "1" value than to read a logical "0" value. In this example, the second set of bits may include fewer logical "1" values than the first set of bits.

In a particular embodiment, the shaping operation is applied by mapping a set of bits corresponding to a set of logical values to a second set of bits corresponding to a different set of logical values to form the shaped data. The mapping may be static (e.g., predetermined) or may be dynamically adjusted such that a frequently occurring set of logical values of the data is mapped to a set of logical values that is associated with reduced current consumption in the shaped data. To illustrate, a controller of the data storage device may count each occurrence of a particular set of logical values in the data. The controller may map a most frequently occurring set of logical values (e.g., "101") to a lowest current consumption set of logical values (e.g., "111"). In this illustrative example, each occurrence of the most frequently occurring set of logical values (e.g., "101") in the data is replaced with the lowest current consumption set of logical values (e.g., "111") in the shaped data. The controller may store a key or mapping table to enable unshaping of the shaped data to recreate the data during a subsequent read operation. In this embodiment, the shaped data may include the same number of bits or a different number of bits as the data.

In another particular embodiment, different shaping operations may be performed for different data. For example, compressible data and non-compressible data may be shaped differently. In this embodiment, the controller may determine whether at least a subset of the data is compressible. When a first subset of the data is non-compressible, a first shaping operation may be applied to the first subset of the first set of bits (e.g., a first mapping operation may be performed). When a second subset of the data is compressible, a second shaping operation may be applied to the second subset of the data. The first shaping operation and the second shaping operation may be different. For example, the second shaping operation may be applied by sequentially or concurrently compressing and shaping the second subset of the data to form compressed and shaped bits. The compressed and shaped bits may include the same number of bits as the second subset of the data before compression or may include fewer bits than the second subset of the data before compression.

The method 300 also includes, at 306, writing the second set of bits to the memory. As a result of the shaping operation, writing the shaped data to the memory may use less write current than writing the original data to the memory would have used. Additionally or in the alternative, as a result of the shaping operation, the shaped data may be read from the memory using less read current than would have been used to read the original data from the memory.

Figure 4:
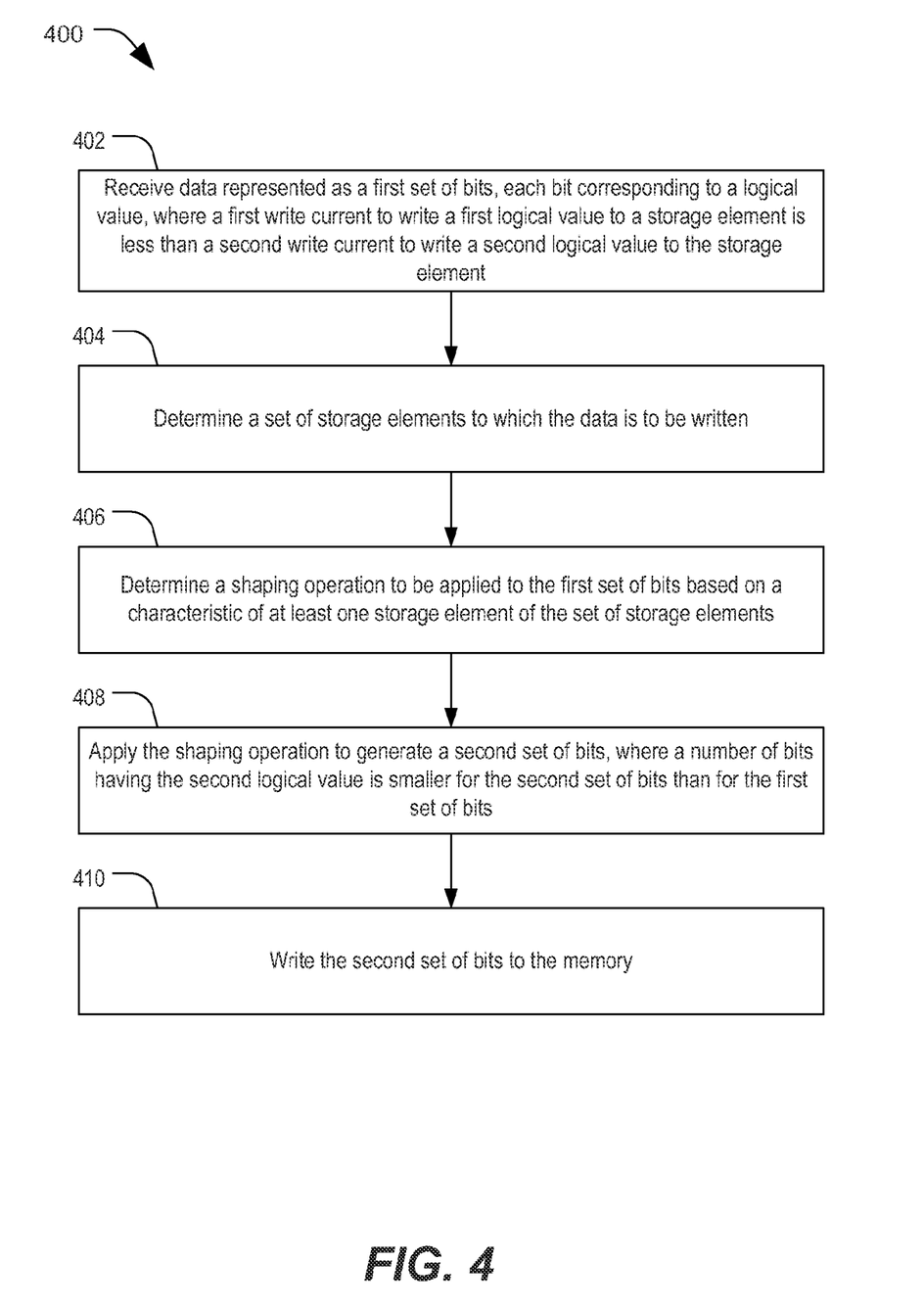
FIG. 4 is a flow diagram illustrating a second particular embodiment of a method of shaping and writing data at a data storage device.

FIG. 4 is a flow diagram illustrating a second particular embodiment of a method 400 of shaping and writing data at a data storage device including a memory having a plurality of resistance-based storage elements. The data storage device may correspond to the data storage device 102 of FIG. 1, the data storage device 102 of FIG. 2, or both. For example, the method 400 may be performed at the controller 106 of FIG. 1 or FIG. 2.

The method 400 includes, at 402, receiving data represented as a first set of bits, where each bit corresponds to a logical value. For example, the data storage device 102 of FIG. 1 may receive the data 120 from the host device 130. As described above, the data storage device may use a first write current to write a first logical value (e.g., a value corresponding to a high-resistance state) to a storage element and may use a second write current to write a second logical value (e.g., a value corresponding to a low-resistance state) to the storage element. In a particular embodiment, the first write current is less than the second write current.

The method 400 includes, at 404, determining a set of storage elements to which the data is to be written. For example, the data may be associated with an address indicating a particular set of storage elements to which the data is to be written, such as a set of storage elements corresponding to a wordline, corresponding to a portion of the wordline, or corresponding to more than one wordline.

The method 400 includes, at 406, determining a shaping operation to be applied to the first set of bits based on a characteristic of at least one storage element of the set of storage elements. For example, as described with reference to FIG. 2, the shaping operation may be selected based on location-dependent characteristics of one or more storage elements, such as a location-dependent current consumption. The location-dependent current consumption may be dependent upon a location of the at least one storage element on a bitline, may be dependent upon a location of the at least one storage element on a wordline, or both.

In another example, as described with reference to FIG. 2, the shaping operation may be selected based on a logical value stored at one or more storage elements adjacent to the at least one storage element in the memory. To illustrate, the shaping operation may be determined to cause a probability that every storage element on a particular bitline has a low-resistance state to be less than a threshold probability. Thus, although the second set of bits are to be written to a particular wordline, the shaping operations may be selected in a manner that reduces write current, read current, or both, associated with a particular bitline.

The method 400 also includes, at 408, applying the shaping operation to generate a second set of bits. The second set of bits is generated such that a number of bits having the second logical value is smaller for the second set of bits than for the first set of bits. That is, the second set of bits includes fewer bits having the second logical value than the first set of bits. For example, as shown in FIG. 1, the second number of bits having each logical value 126 has fewer logical "0" values than the first number of bits having each logical value 122. Accordingly, writing the second set of bits to the memory may use a lower write current than a write current that would be used to write the first set of bits to the memory. As an example, for a particular storage element, a larger programming current may be used to write a logical "0" value than to write a logical "1" value. In this example, the second set of bits (e.g., the shaped data 124 of FIG. 1) includes fewer logical "0" values than the first set of bits (e.g., the data 120 of FIG. 1). As another example, for a particular storage element, a larger programming current may be used to write a logical "1" value than to write a logical "0" value. In this example, the second set of bits includes fewer logical "1" values than the first set of bits.

In a particular embodiment, the data storage devices uses a first read current to read a first logical value (e.g., a value corresponding to a high-resistance state) from a storage element and uses a second read current to read a second logical value (e.g., a value corresponding to a low-resistance state) from the storage element. The first read current may be less than the second read current. As an example, for a particular storage element, a larger read current may be used to read a logical "0" value than to read a logical "1" value. In this example, the second set of bits may include fewer logical "0" values than the first set of bits. As another example, for a particular storage element, a larger read current may be used to read a logical "1" value than to read a logical "0" value. In this example, the second set of bits may include fewer logical "1" values than the first set of bits.

In a particular embodiment, the shaping operation is applied by mapping a set of bits corresponding to a set of logical values to a second set of bits corresponding to a different set of logical values to form the shaped data. The mapping may be dynamically adjusted such that a frequently occurring set of logical values of the data are mapped to a set of logical values that are associated with reduce current consumption in the shaped data. In another particular embodiment, different shaping operations may be performed for different data. For example, compressible data and non-compressible data may be shaped differently, as described above.

The method 400 also includes, at 410, writing the second set of bits to the memory. As a result of the shaping operation, writing the shaped data to the memory may use less write current than writing the original data to the memory would have used. Additionally or in the alternative, as a result of the shaping operation, the shaped data may be read from the memory using less read current than would have been used to read the original data from the memory.

Figure 5:
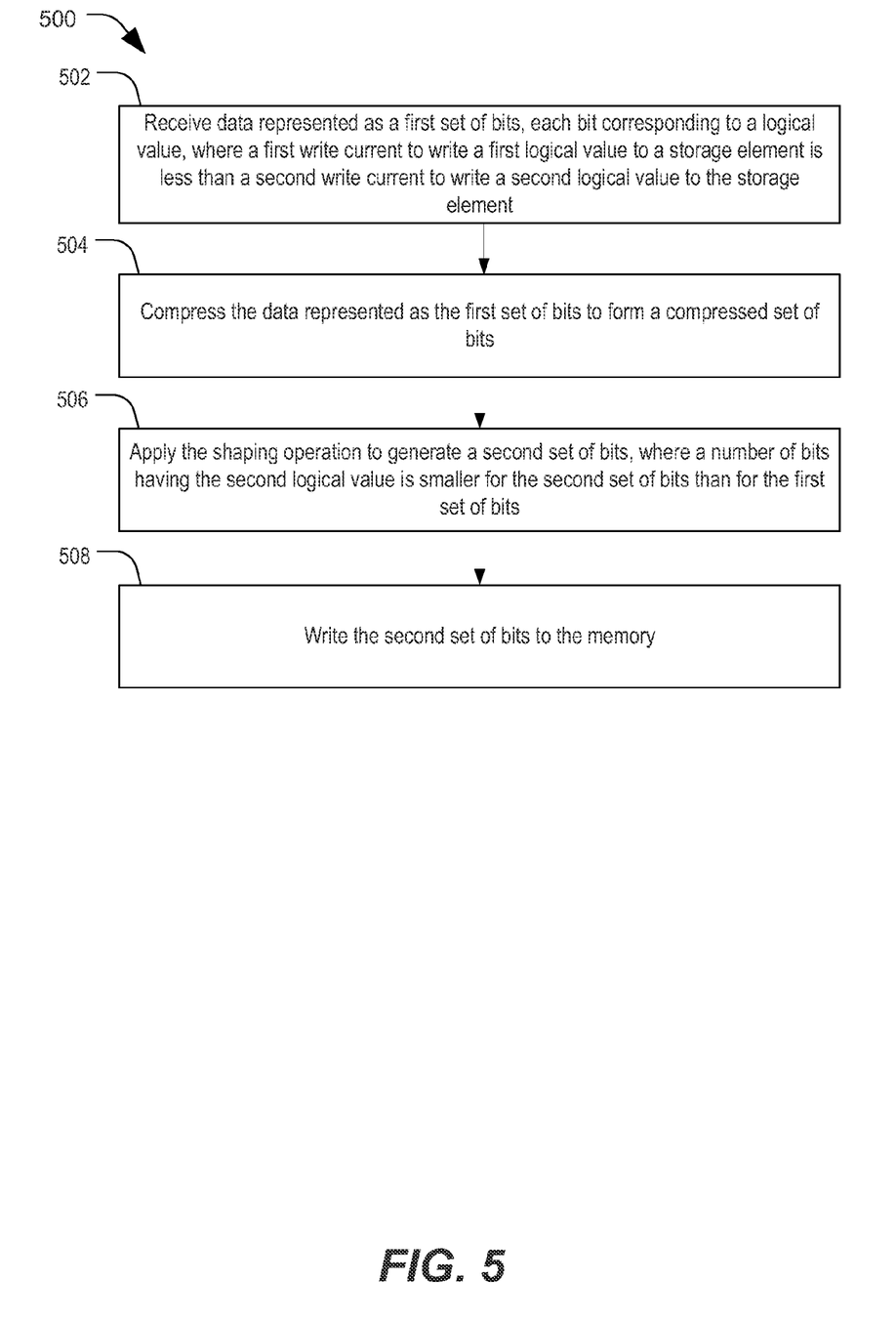
FIG. 5 is a flow diagram illustrating a third particular embodiment of a method of shaping and writing data at a data storage device.

FIG. 5 is a flow diagram illustrating a third particular embodiment of a method 500 of shaping and writing data at a data storage device including a memory having a plurality of resistance-based storage elements. The data storage device may correspond to the data storage device 102 of FIG. 1, the data storage device 102 of FIG. 2, or both. For example, the method 500 may be performed at the controller 106 of FIG. 1 or FIG. 2.

The method 500 includes, at 502, receiving data represented as a first set of bits, where each bit corresponds to a logical value. For example, the data storage device 102 of FIG. 1 may receive the data 120 from the host device 130. As described above, the data storage device may use a first write current to write a first logical value (e.g., a value corresponding to a high-resistance state) to a storage element and may use a second write current to write a second logical value (e.g., a value corresponding to a low-resistance state) to the storage element. In a particular embodiment, the first write current is less than the second write current.

The method 500 also includes, at 504, compressing the data represented as the first set of bits to form a compressed set of bits, and, at 506, applying a shaping operation to the compressed set of bits to generate a second set of bits. The second set of bits is generated such that a number of bits having the second logical value is smaller for the second set of bits than for the first set of bits. For example, as shown in FIG. 1, the shaped data 124 has fewer logical "1" values than the data 120 does. Accordingly, writing the second set of bits to the memory may use a lower write current than a write current that would be used to write the first set of bits to the memory. As an example, for a particular storage element, a larger programming current may be used to write a logical "0" value than to write a logical "1" value. In this example, the second set of bits includes fewer logical "0" values than the first set of bits. As another example, for a particular storage element, a larger programming current may be used to write a logical "1" value than to write a logical "0" value. In this example, the second set of bits includes fewer logical "1" values than the first set of bits.

In a particular embodiment, the data storage devices uses a first read current to read a first logical value (e.g., a value corresponding to a high-resistance state) from a storage element and uses a second read current to read a second logical value (e.g., a value corresponding to a low-resistance state) from the storage element. The first read current may be less than the second read current. As an example, for a particular storage element, a larger read current may be used to read a logical "0" value than to read a logical "1" value. In this example, the second set of bits may include fewer logical "0" values than the first set of bits. As another example, for a particular storage element, a larger read current may be used to read a logical "1" value than to read a logical "0" value. In this example, the second set of bits may include fewer logical "1" values than the first set of bits.

In a particular embodiment, the shaping operation is applied by mapping a set of bits corresponding to a set of logical values to a second set of bits corresponding to a different set of logical values to form the shaped data. The mapping may be dynamically adjusted such that a frequently occurring set of logical values of the data are mapped to a set of logical values that are associated with reduced current consumption in the shaped data.

The method 500 also includes, at 508, writing the second set of bits to the memory. As a result of the shaping operation, writing the shaped data to the memory may use less write current than writing the original data to the memory would have used. Additionally or in the alternative, as a result of the shaping operation, the shaped data may be read from the memory using less read current than would have been used to read the original data from the memory.

Figure 6:
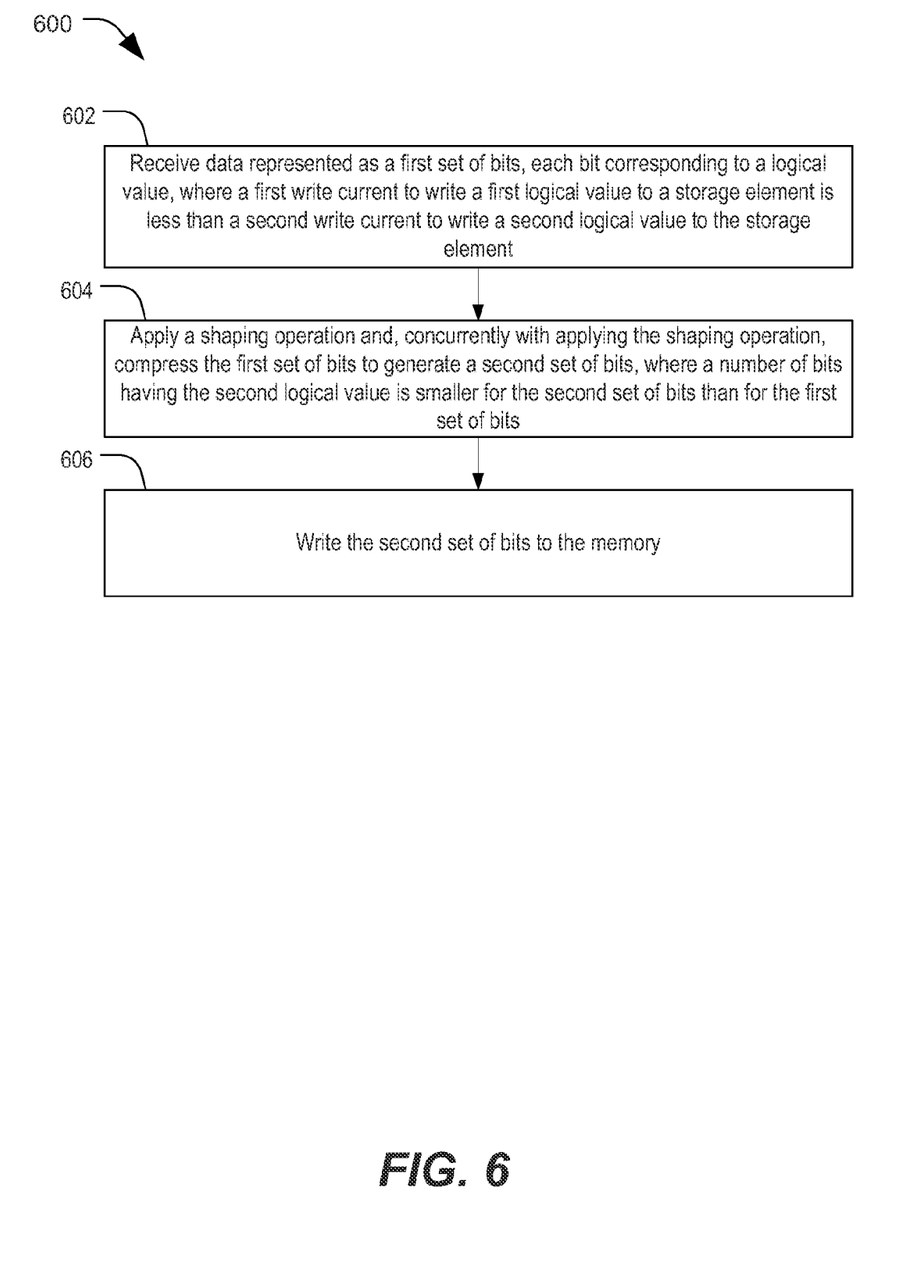
FIG. 6 is a flow diagram illustrating a fourth particular embodiment of a method of shaping and writing data at a data storage device.

FIG. 6 is a flow diagram illustrating a fourth particular embodiment of a method 600 of shaping and writing data at a data storage device including a memory having a plurality of resistance-based storage elements. The data storage device may correspond to the data storage device 102 of FIG. 1, the data storage device 102 of FIG. 2, or both. For example, the method 600 may be performed at the controller 106 of FIG. 1 or FIG. 2.

The method 600 includes, at 602, receiving data represented as a first set of bits, where each bit corresponds to a logical value. For example, the data storage device 102 of FIG. 1 may receive the data 120 from the host device 130. As described above, the data storage devices uses a first write current to write a first logical value (e.g., a value corresponding to a high-resistance state) to a storage element and uses a second write current to write a second logical value (e.g., a value corresponding to a low-resistance state) to the storage element. In a particular embodiment, the first write current is less than the second write current.

The method 600 also includes, at 604, applying a shaping operation and, concurrently with applying the shaping operation, compressing the first set of bits to generate a second set of bits. The second set of bits is generated such that a number of bits having the second logical value is smaller for the second set of bits than for the first set of bits. For example, as shown in FIG. 1, the shaped data 124 includes fewer logical "0" values than the data 120 does. Accordingly, writing the second set of bits to the memory may use a lower write current than a write current that would be used to write the first set of bits to the memory. As an example, for a particular storage element, a larger programming current may be used to write a logical "0" value than to write a logical "1" value. In this example, the second set of bits includes fewer logical "0" values than the first set of bits. As another example, for a particular storage element, a larger programming current may be used to write a logical "1" value than to write a logical "0" value. In this example, the second set of bits includes fewer logical "1" values than the first set of bits.

In a particular embodiment, the data storage devices uses a first read current to read a first logical value (e.g., a value corresponding to a high-resistance state) from a storage element and uses a second read current to read a second logical value (e.g., a value corresponding to a low-resistance state) from the storage element. The first read current may be less than the second read current. As an example, for a particular storage element, a larger read current may be used to read a logical "0" value than to read a logical "1" value. In this example, the second set of bits may include fewer logical "0" values than the first set of bits. As another example, for a particular storage element, a larger read current may be used to read a logical "1" value than to read a logical "0" value. In this example, the second set of bits may include fewer logical "1" values than the first set of bits.

The method 600 also includes, at 608, writing the second set of bits to the memory. As a result of the shaping operation, writing the shaped data to the memory may use less write current than writing the original data to the memory would have used. Additionally or in the alternative, as a result of the shaping operation, the shaped data may be read from the memory using less read current than would have been used to read the original data from the memory.

Figure 7:
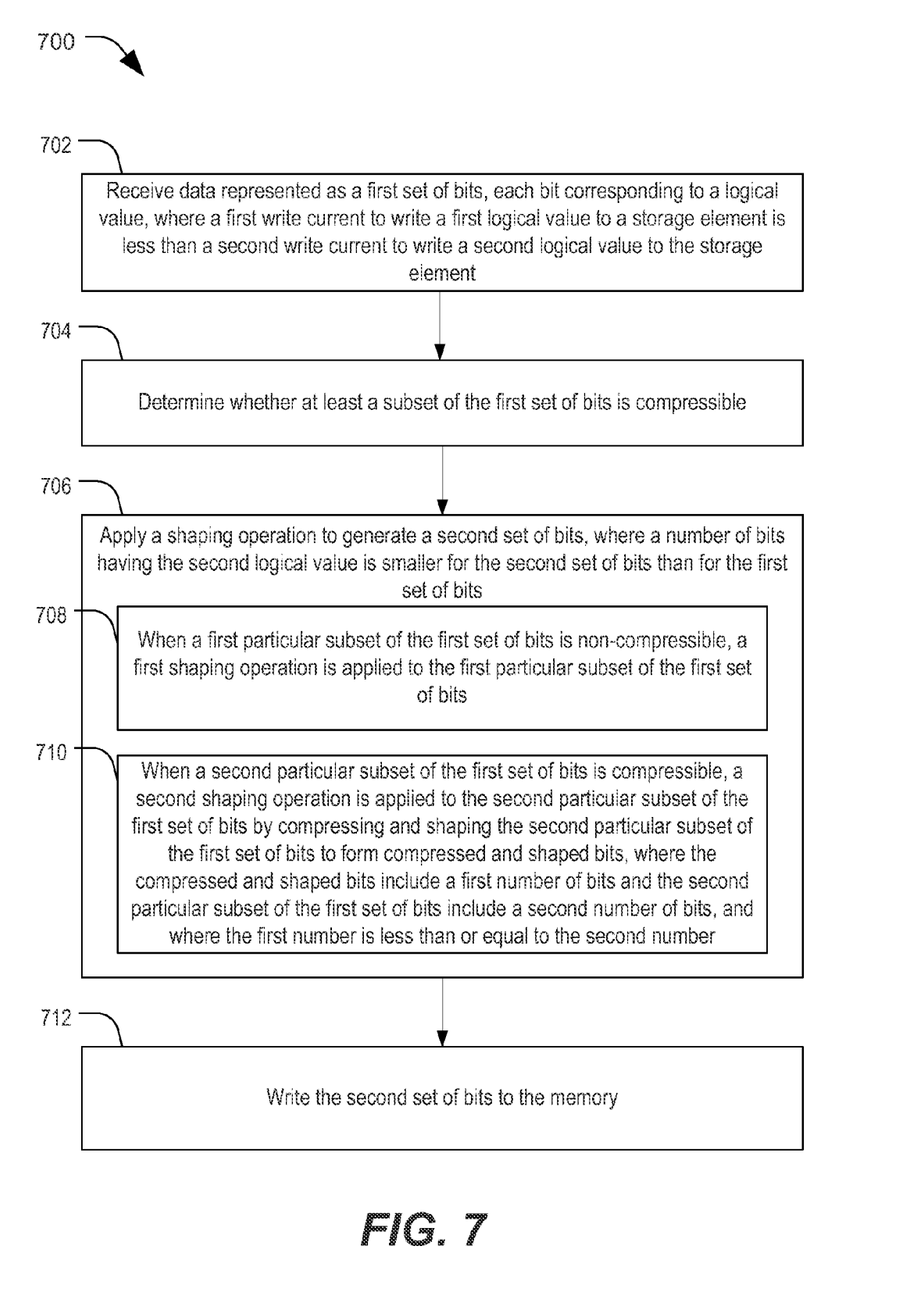
FIG. 7 is a flow diagram illustrating a fifth particular embodiment of a method of shaping and writing data at a data storage device.

FIG. 7 is a flow diagram illustrating a fifth particular embodiment of a method 700 of shaping and writing data at a data storage device including a memory having a plurality of resistance-based storage elements. The data storage device may correspond to the data storage device 102 of FIG. 1, the data storage device 102 of FIG. 2, or both. For example, the method 700 may be performed at the controller 106 of FIG. 1 or FIG. 2.

The method 700 includes, at 702, receiving data represented as a first set of bits, where each bit corresponds to a logical value. For example, the data storage device 102 of FIG. 1 may receive the data 120 from the host device 130. As described above, the data storage devices uses a first write current to write a first logical value (e.g., a value corresponding to a high-resistance state) to a storage element and uses a second write current to write a second logical value (e.g., a value corresponding to a low-resistance state) to the storage element. In a particular embodiment, the first write current is less than the second write current.

The method 700 also includes, at 704, determining whether at least a subset of the first set of bits is compressible, and, at 706, applying a shaping operation to generate a second set of bits. The shaping operation may be applied differently for compressible data and non-compressible data. For example, when a first particular subset of the first set of bits is non-compressible, a first shaping operation may be applied, at 708, to the first particular subset of the first set of bits. To illustrate, the first shaping operation may include mapping a set of bits corresponding to a set of logical values to a second set of bits corresponding to a different set of logical values. The mapping may be dynamically adjusted such that a frequently occurring set of logical values of the data are mapped to a set of logical values that are associated with reduce current consumption in the shaped data.

When a second particular subset of the first set of bits is compressible, a second shaping operation may be applied to the second particular subset of the first set of bits, at 710. The second shaping operation may be different from the first shaping operation. For example, the second shaping operation may be applied by compressing and shaping the second particular subset of the first set of bits to form compressed and shaped bits. The compressed and shaped bits include a first number of bits and the second particular subset of the first set of bits includes a second number of bits, where the first number is less than or equal to the second number.

The second set of bits is generated such that a number of bits having the second logical value is smaller for the second set of bits than for the first set of bits. Accordingly, writing the second set of bits to the memory may use a lower write current than a write current that would be used to write the first set of bits to the memory. As an example, for a particular storage element, a larger programming current may be used to write a logical "0" value than to write a logical "1" value. In this example, the second set of bits includes fewer logical "0" values than the first set of bits. As another example, for a particular storage element, a larger programming current may be used to write a logical "1" value than to write a logical "0" value. In this example, the second set of bits includes fewer logical "1" values than the first set of bits.

In a particular embodiment, the data storage devices uses a first read current to read a first logical value (e.g., a value corresponding to a high-resistance state) from a storage element and uses a second read current to read a second logical value (e.g., a value corresponding to a low-resistance state) from the storage element. The first read current may be less than the second read current. As an example, for a particular storage element, a larger read current may be used to read a logical "0" value than to read a logical "1" value. In this example, the second set of bits includes fewer logical "0" values than the first set of bits. As another example, for a particular storage element, a larger read current may be used to read a logical "1" value than to read a logical "0" value. In this example, the second set of bits includes fewer logical "1" values than the first set of bits.

The method 700 also includes, at 712, writing the second set of bits to the memory. As a result of the shaping operation, writing the shaped data to the memory may use less write current than writing the original data to the memory would have used. Additionally or in the alternative, as a result of the shaping operation, the shaped data may be read from the memory using less read current than would have been used to read the original data from the memory.

Although various components depicted herein are illustrated as block components and described in general terms, such components may include one or more microprocessors, state machines, or other circuits configured to enable a data storage device, such as the data storage device 102 of FIG. 1 or FIG. 1, to perform the particular functions attributed to such components, or any combination thereof. For example, the controller 106 of FIG. 1 or FIG. 2 may represent physical components, such as controllers, state machines, logic circuits, or other structures to instruct the shaper 112, the compression engine, or both, to generate the shaped data 124.

The controller 106 may be implemented using a microprocessor or microcontroller programmed to generate the shaped data 124. In a particular embodiment, the controller 106 includes a processor executing instructions that are stored at the memory 104. Alternatively, or in addition, executable instructions that are executed by the processor may be stored at a separate memory location that is not part of the memory 104, such as at a read-only memory (ROM) (not shown).

In a particular embodiment, the data storage device 102 may be attached or embedded within one or more host devices, such as within a housing of a portable communication device. For example, the data storage device 102 may be within a packaged apparatus, such as a wireless telephone, a personal digital assistant (PDA), gaming device or console, a portable navigation device, or other device that uses internal non-volatile memory. However, in other embodiments, the data storage device 102 may be a portable device configured to be selectively coupled to one or more external devices. In a particular embodiment, the data storage device 102 includes a non-volatile memory, such as a Flash memory (e.g., NAND, NOR, Multi-Level Cell (MLC), Divided bit-line NOR (DINOR), AND, high capacitive coupling ratio (HiCR), asymmetrical contactless transistor (ACT), or other Flash memories), an erasable programmable read-only memory (EPROM), an electrically-erasable programmable read-only memory (EEPROM), a read-only memory (ROM), a Resistive Random Access Memory (RRAM or ReRAM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Accordingly, the disclosure and the figures are to be regarded as illustrative rather than restrictive.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method comprising:
   in a data storage device including a memory including a plurality of resistance-based storage elements, performing:
      receiving data represented as a first set of bits, each bit in the first set of bits corresponding to a logical value, wherein a first write current to write a first logical value to a storage element in the memory is less than a second write current to write a second logical value to the storage element;
      applying a shaping operation to generate a second set of bits, wherein a number of bits having the second logical value is smaller for the second set of bits than for the first set of bits; and
      writing the second set of bits to the memory.

2. The method of claim 1, further comprising:
   determining a set of storage elements of the plurality of resistance-based storage elements to which the data is to be written; and
   determining the shaping operation to be applied to the first set of bits based on a characteristic of at least one storage element of the set of storage elements.

3. The method of claim 2, wherein the characteristic of the at least one storage element is associated with a logical value stored at one or more storage elements adjacent to the at least one storage element in the memory.

4. The method of claim 2, wherein the characteristic of the at least one storage element is associated with a location of the at least one storage element.

5. The method of claim 4, wherein the location is dependent upon a location of the at least one storage element on a bitline.

6. The method of claim 4, wherein the location is dependent upon a location of the at least one storage element on a wordline.

7. The method of claim 4, wherein the location is dependent upon a location of the at least one storage element on a finger.

8. The method of claim 1, wherein applying the shaping operation causes a probability that every storage element on a particular bitline has a low-resistance state to be less than a threshold probability.

9. The method of claim 1, further comprising compressing the data represented as the first set of bits to form a compressed set of bits, wherein the shaping operation is applied to the compressed set of bits to generate the second set of bits.

10. The method of claim 1, further comprising compressing the first set of bits concurrently with applying the shaping operation to generate the second set of bits.

11. The method of claim 1, further comprising:
    determining whether at least a subset of the first set of bits is compressible,
    wherein:
       when a first particular subset of the first set of bits is non-compressible, a first shaping operation is applied to the first particular subset of the first set of bits; and
       when a second particular subset of the first set of bits is compressible, a second shaping operation is applied to the second particular subset of the first set of bits by compressing and shaping the second particular subset of the first set of bits to form compressed and shaped bits, wherein the compressed and shaped bits include a first number of bits and the second particular subset of the first set of bits include a second number of bits, wherein the first number is less than or equal to the second number.

12. The method of claim 1, wherein, for a particular storage element, a larger programming current is used to write a logical zero value than to write a logical one value, and wherein the second set of bits includes fewer logical zero values than the first set of bits.

13. The method of claim 1, wherein, for a particular storage element, a larger programming current is used to write a logical one value than to write a logical zero value, and wherein the second set of bits includes fewer logical one values than the first set of bits.

14. The method of claim 1, wherein, for a particular storage element, a larger read current is used to read a logical zero value than to read a logical one value, and wherein the second set of bits includes fewer logical zero values than the first set of bits.

15. The method of claim 1, wherein, for a particular storage element, a larger read current is used to read a logical one value than to read a logical zero value, and wherein the second set of bits includes fewer logical one values than the first set of bits.

16. A data storage device comprising:
a controller; and
a memory including a plurality of resistance-based storage elements,
wherein the controller is configured to:
receive data represented as a first set of bits, each bit of the first set of bits corresponding to a logical value, wherein a first write current to write a first logical value to a storage element of the memory is less than a second write current to write a second logical value to the storage element of the memory;
apply a shaping operation to generate a second set of bits, wherein a number of bits having the second logical value is smaller for the second set of bits than for the first set of bits; and
write the second set of bits to the memory.

17. The data storage device of claim 16, wherein the controller is further configured to:
determine a set of storage elements of the plurality of storage elements to which the data is to be written; and
determine the shaping operation to be applied to the first set of bits based on a characteristic of at least one storage element of the set of storage elements.

18. The data storage device of claim 17, wherein the characteristic of the at least one storage element is associated with a logical value stored at one or more storage elements adjacent to the at least one storage element in the memory.

19. The data storage device of claim 17, wherein the characteristic of the at least one storage element is associated with a location of the at least one storage element.

20. The data storage device of claim 19, wherein the location is dependent upon a location of the at least one storage element on a bitline.

21. The data storage device of claim 19, wherein the location is dependent upon a location of the at least one storage element on a wordline.

22. The data storage device of claim 19, wherein the location is dependent upon a location of the at least one storage element on a finger.

23. The data storage device of claim 16, wherein applying the shaping operation causes a probability that every storage element on a particular bitline has a low-resistance state to be less than a threshold probability.

24. The data storage device of claim 16, wherein the controller is further configured to compress the data represented as the first set of bits to form a compressed set of bits, wherein the shaping operation is applied to the compressed set of bits to generate the second set of bits.

25. The data storage device of claim 16, wherein the controller is further configured to compress the first set of bits concurrently with applying the shaping operation to generate the second set of bits.

26. The data storage device of claim 16, wherein the controller is further configured to determine whether at least a subset of the first set of bits is compressible, wherein:
when a first particular subset of the first set of bits is non-compressible, a first shaping operation is applied to the first particular subset of the first set of bits; and
when a second particular subset of the first set of bits is compressible, a second shaping operation is applied to the second particular subset of the first set of bits by compressing and shaping the second particular subset of the first set of bits to form compressed and shaped bits, wherein the compressed and shaped bits include a first number of bits and the second particular subset of the first set of bits include a second number of bits, wherein the first number is less than or equal to the second number.

27. The data storage device of claim 16, wherein, for a particular storage element of the memory, a larger programming current is used to write a logical zero value than to write a logical one value, and wherein the second set of bits includes fewer logical zero values than the first set of bits.

28. The data storage device of claim 16, wherein, for a particular storage element of the memory, a larger programming current is used to write a logical one value than to write a logical zero value, and wherein the second set of bits includes fewer logical one values than the first set of bits.

29. The data storage device of claim 16, wherein, for a particular storage element of the memory, a larger read current is used to read a logical zero value than to read a logical one value, and wherein the second set of bits includes fewer logical zero values than the first set of bits.

30. The data storage device of claim 16, wherein, for a particular storage element of the memory, a larger read current is used to read a logical one value than to read a logical zero value, and wherein the second set of bits includes fewer logical one values than the first set of bits.

* * * * *